United States Patent [19]

Wright

[11] 4,149,098
[45] Apr. 10, 1979

[54] A. C. SWITCHING SYSTEM
[75] Inventor: Malcolm T. Wright, Sunnyvale, Calif.
[73] Assignee: The United States of America as represented by the Secretary of the Navy, Washington, D.C.
[21] Appl. No.: 688,444
[22] Filed: May 20, 1976
[51] Int. Cl.² .............................................. H03K 17/00
[52] U.S. Cl. .................... 307/255; 307/270; 307/315
[58] Field of Search ............... 307/255, 235, 313, 270; 330/20

[56] References Cited
U.S. PATENT DOCUMENTS

| 3,157,870 | 11/1964 | Marino et al. | 307/235 W |
| 3,417,292 | 12/1968 | Dupont et al. | 361/88 |
| 3,448,395 | 6/1969 | Webb | 330/20 |
| 3,538,353 | 11/1970 | Hanger | 307/255 |

FOREIGN PATENT DOCUMENTS 6617000  11/1966  Netherlands .............................. 307/255

Primary Examiner—Stanley D. Miller, Jr.
Assistant Examiner—B. P. Davis
Attorney, Agent, or Firm—R. S. Sciascia; Charles D. B. Curry; Francis I. Gray

[57] ABSTRACT

An A.C. power return to provide a path to ground according to predetermined logic. A potential switch stage is coupled to a phase inverter which is coupled to an output stage. Impressed potentials in the phase inverter stage are selected to assure that a path to ground will only exist when an on logic signal is present. Power transistors in the output stage minimize power dissipation within the switch.

7 Claims, 2 Drawing Figures

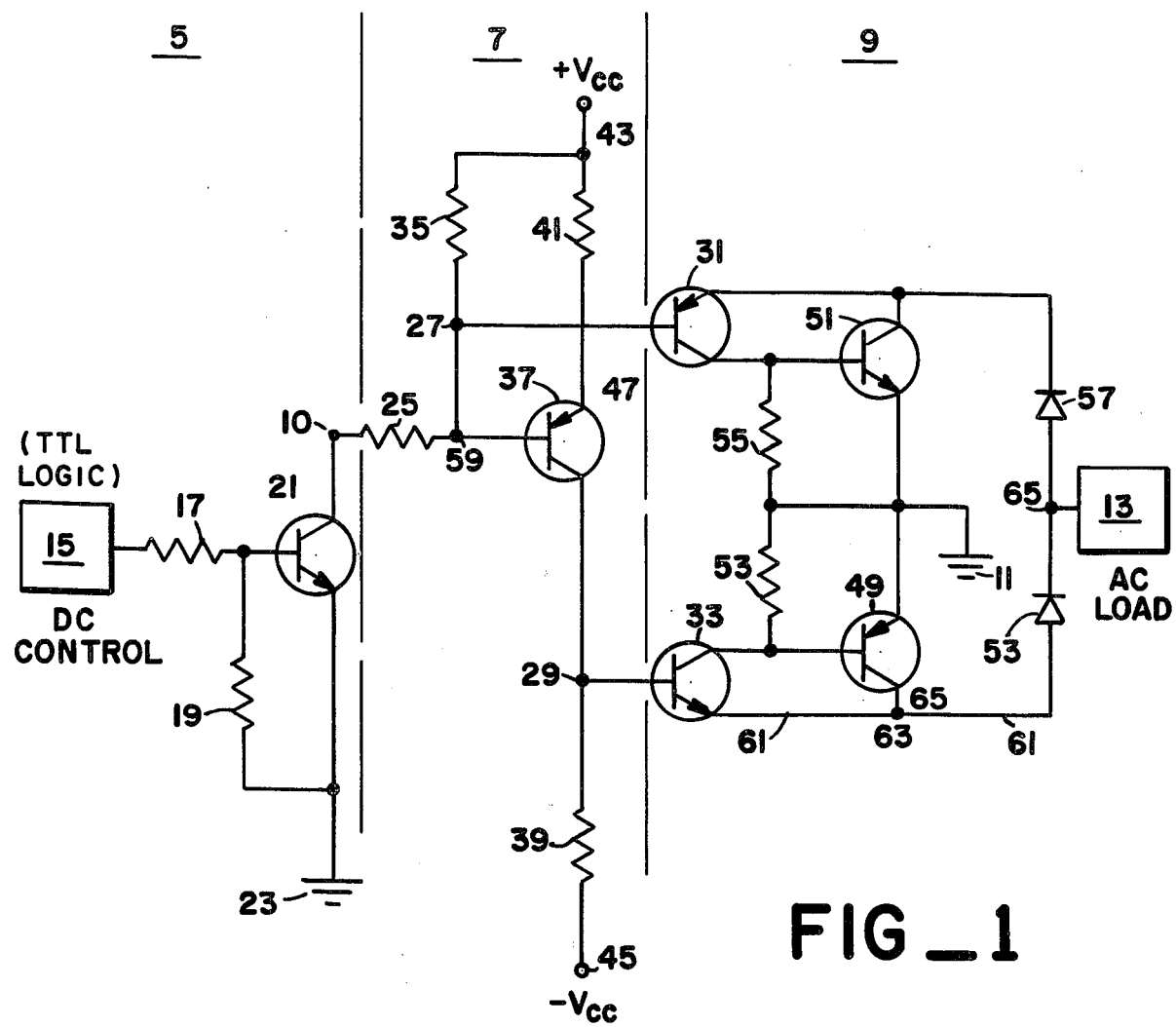
FIG_1
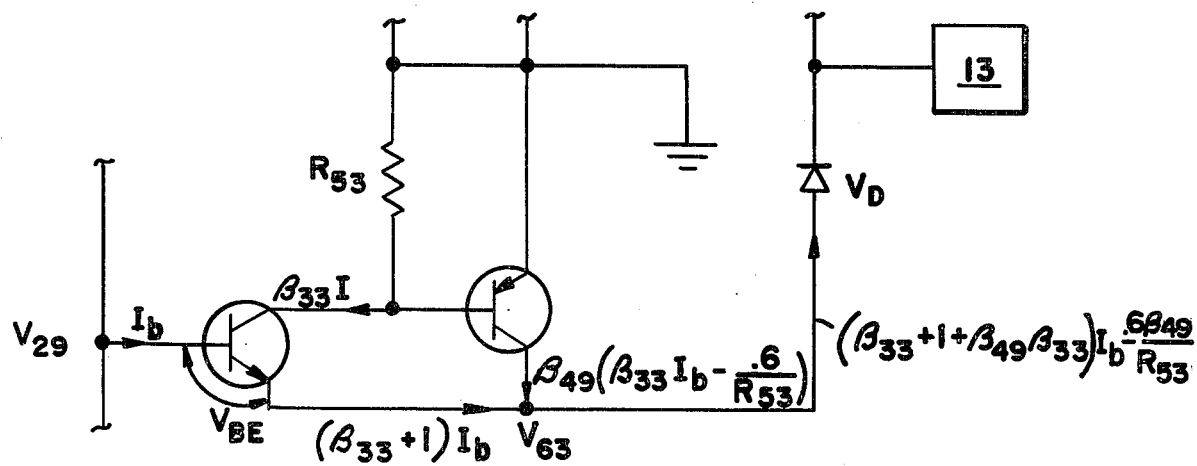
FIG_2

A. C. SWITCHING SYSTEM

BACKGROUND OF THE INVENTION

1. Field of the Invention

The present invention relates to electronic switches. In particular it relates to switching devices which provide a path to ground for an A.C. load in accordance with predetermined D.C. logic.

2. Description of the Prior Art

The switching of A.C. power has been achieved by solid state means previously. SCR's, SCS's and TRIAC's are commonly used for such applications. However, each of these specialized devices are limited by the existence of a parameter "critical rate-of-rise of off state voltage," $(dv/dt)_c$. For any of the above-named devices, this parameter limits the device to a maximum rate the voltage can change across the device before it will turn itself on without the application of a trigger or control signal. Hence such a switch will become uncontrolled. The use of square wave power is beneficial for many advanced electronics applications. Such power has an extremely high $dv/dt$ often exceeding the "critical rate" described above of otherwise desirable SCR's, SCS's or TRIAC's.

One common switching arrangement which avoids the critical rate problem associated with the above-named devices is the use of transistors inside a diode bridge. Such an arrangement requires a complex drive circuitry which must be isolated from the switching element to maintain proper operation of the diode bridge arrangement.

These problems and others have been overcome by the present invention which provides a potential switch coupled to a phase inverter which is coupled to an output stage.

SUMMARY OF THE INVENTION

Briefly, the present invention comprises a potential switch stage coupled to a phase inverter which is coupled to an output stage. Impressed potentials in the phase inverter stage are selected to assure that a path to ground only exists when a logic signal is present. Power transistors are arrayed in the output stage to supply current and regulate power dissipation within the switch.

STATEMENT OF THE OBJECTS OF THE INVENTION

An object of the present invention is to provide a switch to drive an A.C. load by predetermined D.C. logic.

A further object of the present invention is to achieve the above object by means of a switch which minimizes power dissipation within the switch.

Another object of the present invention is to achieve a switch capable of reliable operation in conjunction with a load consisting of square wave power or the like.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a schematic view of the present invention; and

FIG. 2 is a view of the output stage of the present invention illustrating the operation thereof.

DESCRIPTION OF THE PREFERRED EMBODIMENT

Referring now to FIG. 1 there is shown a schematic view of the switch of the present invention. It is seen that the invention comprises three stages of circuitry. From the left in FIG. 1, a potential switch stage 5 is joined to a phase inverter 7 which is coupled to an output stage 9. The switch may provide a path to electrical ground 11 for an A.C. load 13. The invention is activated by a D.C. voltage source 15 which may be a control signal, for example, for the load 13.

Potential switch stage 5 functions to cause a drop in the potential of point 10 from $+V_{cc}$ to near zero to response to an "on" command from D.C. voltage source 15. A pair of resistors 17 and 19 comprise a voltage divider. Transistor 21 is interposed between the resistors 17 and 19 and ground 23 in the common-emitter configuration. The transistor 21 shown in FIG. 1 has been chosen of the NPN type to allow the switch to be driven by positive logic from D.C. voltage source 15. An equivalent switch driven by negative logic would require a PNP transistor 21.

Operationally, phase inverter stage 7 causes the potential at point 27 to be reduced from $+V_{cc}$ to a positive value near zero and that at point 29 to rise from $-V_{cc}$ to a similar small positive value. The collector of transistor 21 is coupled to a small value resistance 25. As will appear from the operational discussion infra, it is necessary for the operation of the present invention that points 27 and 29, providing base potential to driver transistors 31 and 33, be maintained at small values (near-zero potential). Resistor 35 is chosen in relation to resistor 25 so that the bulk of impressed potential $+V_{cc}$ will be dissipated across resistor 35. In an operative embodiment of the present invention a configuration was chosen having a $V_{cc}$ of $+40$ volts D.C. operated upon a resistance 35 of 10,000 ohms and resistance 25 of 33 ohms. Such values are by no means intended to limit the scope of the present invention but rather are given for the sole purpose of illustrating operative relative magnitudes for resistances 35 and 25.

Transistors 37 is oriented between imposed voltages $+V_{cc}$ and $-V_{cc}$. Resistance 39, interposed between $-V_{cc}$ and the collector of transistor 37 is designed to be of somewhat greater magnitude than resistance 41. The relatively large values of both resistance 41 and resistance 39 provide for the dissipation of nearly all of the $2V_{cc}$ potential difference between points 43 and 45 within those resistors, resulting in a potential of slightly greater than zero at point 29 and a somewhat more positive potential at point 47.

Output stage 9 provides an interface for the present invention with an A.C. load 13. The A.C. load 13 may present sinusoidal or square wave power to the invention. A pair of driver transistors 33 and 31 are coupled respectively to points 29 and 27 which have been adjusted by design of phase inverter 7 to near-zero potential (during which "on"). The transistors 33 and 31 serve to "drive" power transistors 49 and 51 as will be discussed in the theoretical discussion to follow. A pair of resistors 53 and 55 serve to bleed off leakage current from the power transistors 49 and 51. Diodes 53 and 57 are interposed between load 13 and transistors 33 and 31 to avoid the imposition of a potentially harmful reverse emitter-base bias voltage upon those transistors.

In order that the present invention may be better understood a theoretical explanation will now be given.

It is to be understood, however, that this theoretical explanation is given merely for the purpose of exposition in order that the invention may be better appreciated. While this theoretical explanation is believed to be correct, it is not of necessity complete nor does the operation of the invention depend upon its accuracy or otherwise.

In operation, resistors 17 and 19 are chosen in conjunction with D.C. voltage source 15 and transistor 21 so that a sufficient base-emitter bias (current) will be applied to transistor 21 to turn the transistor on in response to an "on" command from D.C. voltage source 15. Transistor 21 being turned on, a current path to ground 23 now exists in the switch of the present invention. $V_{cc}$ is so chosen in relation to the resistors 35 and 41 and the voltage divider formed thereby and resistor 25 that, when transistor 21 is on, (1) a sufficient base to emitter bias will be achieved to turn on transistor 37 and (2) there will be a sufficient potential drop that points 27, 59 and 47 will be at a small positive potential. A voltage drop between points 47 and 59 thus occurs when transistor 21 is on, providing a current path to ground 23 and providing the bias to turn on transistor 37. Once transistor 37 is on a current path exists between $-V_{cc}$ and $+V_{cc}$ through resistors 41 and 39. As referred to above, the magnitude of resistance 39 is chosen so that a small positive potential exists, upon flow of current through the saturated transistor 37 at point 29. It is seen that upon actuation of the switch of the present invention by an appropriate D.C. voltage 15, points 27 and 29 are altered in potential from $+V_{cc}$ and $-V_{cc}$ to small positive values (near zero).

An A.C. power source (not shown), for which the switch provides a current path when "on," acts upon load 13 causing the present invention to sense A.C. power at point 65. A protective diode 53 is interposed between the load 13 and driver transistor 33 to protect transistor 33 from the positive-going cycles of the load 13 while a similar diode 57 protects driver transistor 31 from the negative-going cycles of the load 13. Impressed voltages $+V_{cc}$ and $-V_{cc}$ are chosen to be more positive and more negative than the alternating amplitudes of load 13 so a path to ground 11 will not exist when there is no "on" signal at D.C. voltage source 15. It will be seen that the two driver transistors are in emitter-follower configuration with respect to the potential across load 13.

The operation of the portion of the switch comprising driver transistor 31, resistor 55, power transistor 51 and diode 57 is identical, except for reversed polarities, to that comprising driver transistor 33, resistor 53, power transistor, 49 and diode 53. The discussion that follows will therefore refer only to the latter branch of this portion of the invention though pertaining equally in theory to the former branch.

Referring to FIG. 2 in conjunction with FIG. 1, a potential voltage barrier $V_D$ exists due to the presence of diode 53 which voltage difference must be overcome, with proper polarity, prior to the conduction of current through diode 53. The presence of driver transistor 33 having its base-emitter junction in series with diode 53 means that an additional potential difference $V_{BE}$ ($= V_{29} - V_{63}$) must be attained for the conduction of current in branch 61 of the present invention. Thus, the generation of a voltage difference of ($V_{BE} + V_D$) with proper polarity (point 29 being for all practical purposes at zero potential when the invention is on) will cause a flow of current in the switch through branch 61. The switch of the present invention in the presence of an "on" signal from D.C. voltage source 15 will provide a current path to ground 11 for load 13 and thus the function represented by load 13 will operate. The power loss caused by the presence of the switch of the present invention will be ($V_{63} + V_D$) times the current flowing through load 13.

The driver transistor 33 being in an emitter-follower configuration, a voltage difference of $V_{BE} + V_D$ will be the maximum achievable potential drop between point 29 and point 65. When a higher potential difference with the proper forward polarity appears across points 29 and 65 the driver transistor 33, diode 53 combination will respond by a tendency to pass an increased flow of current from the emitter of driver transistor 33 into branch 61. Insofar as such a current flow may be accomplished by an increased flow of current into the base of driver transistor 33, an undesirable drop in the potential of point 29, $V_{29}$, will be achieved. Such a drop results from the fact that current flow within phase inverter 7 from point 43 to point 45 will be diverted or siphoned to some extent at point 29 lessening the potential difference between points 29 and 45 caused by a reduced current flow through resistor 39. Such a drop in potential is undesirable in light of the emitter-follower current characteristic, and the constant voltage difference existing thereby, in that the potential measured at point 65 becomes unregulated following the fluctuation of the potential of point 29. Thus it is desirable that a large source of current be made by the present invention to feed load 13 without drawing additional base current into driver transistor 33 from phase inverter 7.

Refer now particularly to FIG. 2, wherein there is shown in scientific notation the operation of the output stage. At saturation the collector current of driver transistor 33 is $\beta_{33} I_b$ where $I_b$ is the base current of the transistor 33 (i.e., the current desired to be minimized in the present inventive configuration) and $\beta_{33}$ represents the transistor's characteristic gain. Emitter current of transistor 33 at saturation is the sum of these two currents, or $(\beta_{33} + 1) I_b$. Due to the fact that the collector of driver transistor 33 is coupled to the base of power transistor 49, the base current of power transistor 49 is approximately $\beta_{33} I_b$. Such a base current flow in power transistor 49 will generate a collector current in power transistor 49 of $\beta_{49}(\beta_{33} I_b - 0.6/R_{53})$ where $0.6/R_{53}$ is due to the resistor bypass current with a typical silicon transistor. Junction 63 provides a summing node for currents flowing through branches 61 and 65 and hence the total current flow available to the load 13 is $(\beta_{33} + 1) I_b + \beta_{49}(\beta_{33} I_b - 0.6/R_{53})$ or $(\beta_{33} + \beta_{49}\beta_{33} - 0.6\beta_{49}/R_{53} I_b + 1) I_b$. Thus the addition of power transistor 49 in the configuration of the present invention adds $\beta_{49}(\beta_{33} I_b - 0.6/R_{53})$ of current to the load 13 without altering the potential of point 29 (or, conversely, of point 27).

Thus it is seen that the present invention provides a fast switching system capable of providing a current path to an A.C. load while introducing minimal power losses to the load due to its presence.

What is claimed is:
1. An A.C. switch which comprises:
   (a) a potential switch stage for receiving a control signal;
   (b) an output stage electrically coupled to an A.C. power supply; and

(c) a phase inverter electrically coupled between said potential switch stage and said output stage, said phase inverter including:
  (i) a first impressed voltage;
  (ii) a second impressed voltage;
  (iii) said first impressed voltage being positive and said second impressed voltage being negative; and
  (iv) said first impressed voltage being greater in positive value than any positive-going cycle of said A.C. power supply and said second impressed voltage being greater in negative value than any negative-going cycle of said A.C. power supply.

2. An A.C. switch as described in claim 1 wherein said output stage comprises:
  (a) a first half adapted to respond to cycles of one polarity of said A.C. load;
  (b) a second half adapted to respond to cycles of the opposite polarity of said A.C. load; and
  (c) an electrical ground to provide an electrical path for said A.C. load when said control signal is impressed upon said A.C. switch at said potential switch stage.

3. An A.C. switch as described in claim 2 wherein each of said halves of said output stage comprises:
  (a) a power transistor in common emitter configuration;
  (b) the base of said power transistor in series with the collector of a driver transistor;
  (c) said driver transistor having its base coupled to said near-zero potential output of said phase inverter;
  (d) the emitter of said driver transistor in electrical connection with the collector of said power transistor; and
  (e) a protective diode located between the electrical junction of the emitter of said driver transistor and the collector of said power transistor and said A.C. load so that said A.C. load provides the bias voltage for said half of said output stage during the cycles having the proper polarity.

4. An A.C. switch as recited in claim 3 wherein said potential switch stage comprises a transistor in a common-emitter configuration with said control signal input to the base and with the collector connected to the input of said phase inverter.

5. An A.C. switch as recited in claim 2 wherein said phase inverter further comprises a transistor with the output of said potential switch stage connected to the base through a resistor to provide a first near-zero voltage output when said control signal is applied, the base being connected to the input of said first half of said output stage, with bias resistors connected between said first impressed voltage and the emitter and between said second impressed voltage and the collector to produce a second near-zero voltage output at the collector when said control signal is applied, the collector being connected to the input of said second half of said output stage.

6. An A.C. switch as described in claims 4 or 5 wherein said control signal source comprises a D.C. logic input coupled to said potential switch stage.

7. An A.C. switch as described in claim 6 wherein said logic input comprises TTL logic.

* * * * *